United States Patent [19]

Tukizi

[11] Patent Number: 5,311,051
[45] Date of Patent: May 10, 1994

[54] FIELD EFFECT TRANSISTOR WITH OFFSET REGION

[75] Inventor: Masaru Tukizi, Tokyo, Japan

[73] Assignee: NEC Corporation, Tokyo, Japan

[21] Appl. No.: 854,084

[22] Filed: Mar. 19, 1992

[30] Foreign Application Priority Data

Mar. 19, 1991 [JP] Japan .................. 3-053039

[51] Int. Cl.5 .................. H01L 29/76; H01L 29/94
[52] U.S. Cl. .................. 257/409; 257/339
[58] Field of Search .................. 257/339, 409

[56] References Cited

U.S. PATENT DOCUMENTS

| 4,300,150 | 11/1981 | Colak | 257/339 |
|---|---|---|---|
| 4,811,075 | 3/1989 | Eklund | 257/409 |
| 4,823,173 | 4/1989 | Beasom | 257/409 |
| 5,023,678 | 6/1991 | Kinzer | 257/409 |
| 5,072,268 | 12/1991 | Rumennik | 257/409 |
| 5,089,871 | 2/1992 | Fujihara | 257/409 |
| 5,162,883 | 11/1992 | Fujihara | 257/339 |

OTHER PUBLICATIONS

"Device Design of an Ion Implanted High Voltage MOSFET", I. Yoshida, et al., Supplement to the Journal of the Japan Society of Applied Physics, vol. 44, 1975, pp. 249-255.

Primary Examiner—Rolf Hille
Assistant Examiner—Steven Loke
Attorney, Agent, or Firm—Burns, Doane, Swecker & Mathis

[57] ABSTRACT

In a high breakdown voltage MOSFET having an offset region consisting of a low concentration impurity layer with the same conductivity type as that of a drain region between a channel region and the drain region, an impurity layer with conductivity type opposite to that of the drain region is formed on the surface of the offset region. With such a constitution, even for the case when the energy levels generated in the interface of silicon/oxide film under the environment of exposure to radiations act as the scattering centers, the drain current will not be affected by the levels. Further, the reliability of the high breakdown voltage MOSFET can be improved markedly, by suppressing the deterioration in the charge mobility due to generation of the interface levels and the accompanying reduction in the drain current.

6 Claims, 7 Drawing Sheets

FIELD EFFECT TRANSISTOR WITH OFFSET REGION

BACKGROUND OF THE INVENTION

1. Field of the Invention

The present invention relates to a semiconductor device, and more particularly, to a high breakdown voltage field effect transistor equipped with an offset region.

2. Description of the Prior Art

As a prior art field effect transistor with high breakdown voltage (referred to a high breakdown voltage MOSFET hereinafter) there is known one type in which a low concentration impurity layer having the same conductivity type as that of a drain region is inserted between the drain region and a channel region.

A MOSFET of the above-mentioned type in which P+ type source and drain regions 101 and 102 are formed in an N type substrate, and a P type offset region 103 is formed between the drain region 102 and a channel region, as shown in FIG. 10, is disclosed in Supplement to the Journal of the Japan Society of Applied Physics, Vol. 44, 1985, p. 249.

In this high breakdown voltage MOSFET a high value of the breakdown voltage is attained by the widespread formation of a depletion layer in the surroundings of the offset region 103 when the transistor is in the off-state. Further, when the transistor is in the on-state, the offset region 103 acts as a drift region, and by virtue of this a current flows between the source and the drain.

In general, semiconductor devices used in the vicinity of a nuclear reactor or in the space are exposed to a high dose of radiations and develop irreparable radiation damage within the devices. When radiations such as X rays or gamma rays are incident on the gate oxide film of a MOSFET, the bonding between silicon and oxygen that was present at the interface of the gate oxide film and the substrate is broken, generating an energy level (or levels) in the interface.

These levels act as the scattering centers which obstruct the undisturbed flow of the carriers in the transistor, and deteriorates the mobility of the carriers. Due to the deterioration of the mobility the maximum drain current is reduced. When the degradation of the transistor characteristics due to exposure to radiation proceeds further, there arises the problem that the drain current diminishes and eventually the transistor operation ceases to work.

SUMMARY OF THE INVENTION

It is an object of the invention to provide a semiconductor device including a high breakdown voltage MOSFET which has a small deterioration in the characteristics even when it is used in a radiation environment.

The semiconductor device according to this invention is characterized in having a semiconductor substrate of one conductivity type, a gate insulating film formed on one principal plane of the semiconductor substrate, a gate formed on the insulating film, a source region and a drain region of the opposite conductivity type provided on the respective sides of the gate facing with each other, an offset region with the opposite conductivity type provided in the semiconductor substrate between the drain region and the gate, and an impurity region with the one conductivity type provided within the offset region.

It is preferable that the impurity region of the one conductivity type is provided adjacent to the drain region.

According to this invention, a source region and a drain region of the opposite conductivity type are provided in the semiconductor substrate of the one conductivity type, an offset region of the opposite conductivity type is provided in the semiconductor substrate between the gate on the semiconductor substrate and the drain region, and an impurity region of the one conductivity type is provided within the offset region, so that the carriers that move between the source and the drain reach the drain via the offset region other than the impurity region without going through the surface part of the semiconductor substrate. Therefore, even if energy levels are generated in the substrate surface due to irradiation of radiations, these carriers will not be subjected to scattering by these levels, and the deterioration of the mobility, that is, the reduction in the drain current can be prevented. Thus, according to the present invention it is possible to obtain a MOSFET excellent in radiation resistance even in the use under a radiation environment.

BRIEF DESCRIPTION OF THE DRAWINGS

The above and the other objects, features, and advantages of this invention will become more apparent by reference to the following detailed description of the invention taken in conjunction with the accompanying drawings, wherein.

DETAILED DESCRIPTION OF THE PREFERRED EMBODIMENTS

Figure 1A:
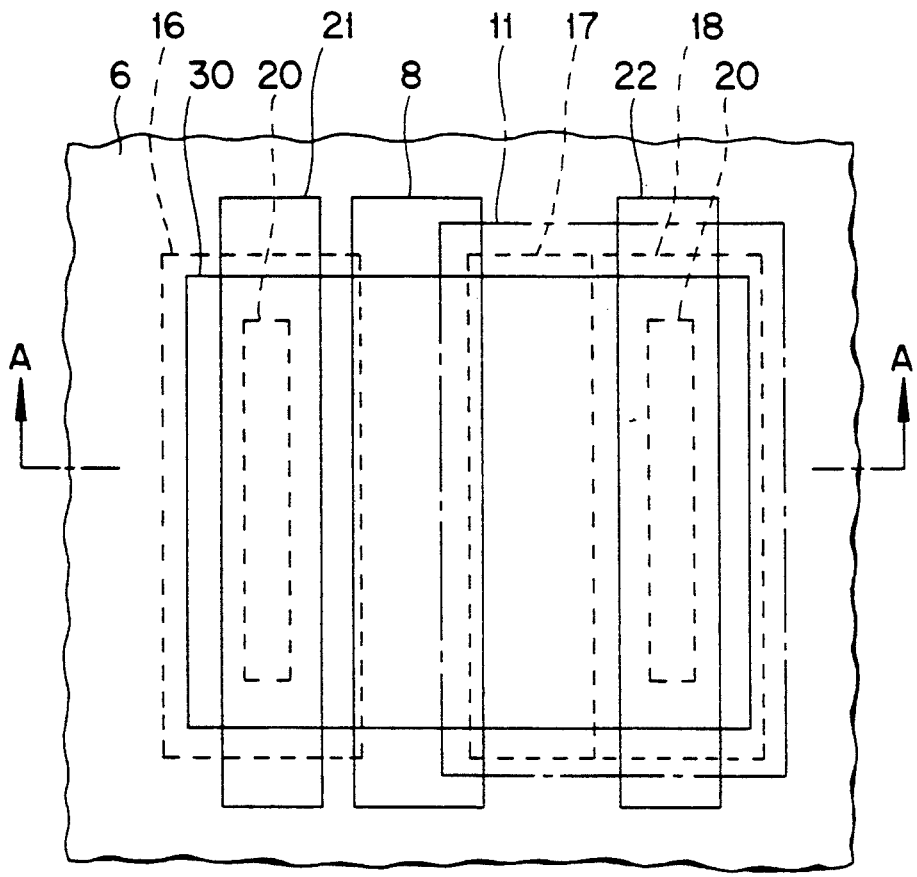
FIG. 1(a) shows a plan view of a first embodiment of the invention and FIG. 1(b) shows a sectional view taken along the line A—A of the plan view.

First, referring to the drawings, the first embodiment of the invention will be described. As shown in FIG. 1(b), a field oxide film 6 for device isolation is provided in a P type substrate 1, and a P+ type impurity region 5 that acts as a channel stopper for preventing generation of parasitic MOS is provided beneath the field oxide film 6. On the surface of the substrate 1, a polycrystalline silicon gate electrode 8 with 5 μm gate length is provided via a gate oxide film 7. Matched with the gate electrode 8, a 0.5 μm thick N+ type source region 16 whose impurity density is $10^{21}$ atom/cm$^3$ and a 2 μm thick N− type offset region 11 are provided, and a 0.5 μm thick N+ type drain region 18 having impurity density of $10^{21}$ atom/cm$^3$ is provided within the N− type offset region 11. In addition, within the N− type offset region 11 between the N+ type drain region 18 and the gate electrode 8 there is provided a 0.5 μm thick P type impurity region 17.

Figure 1B:
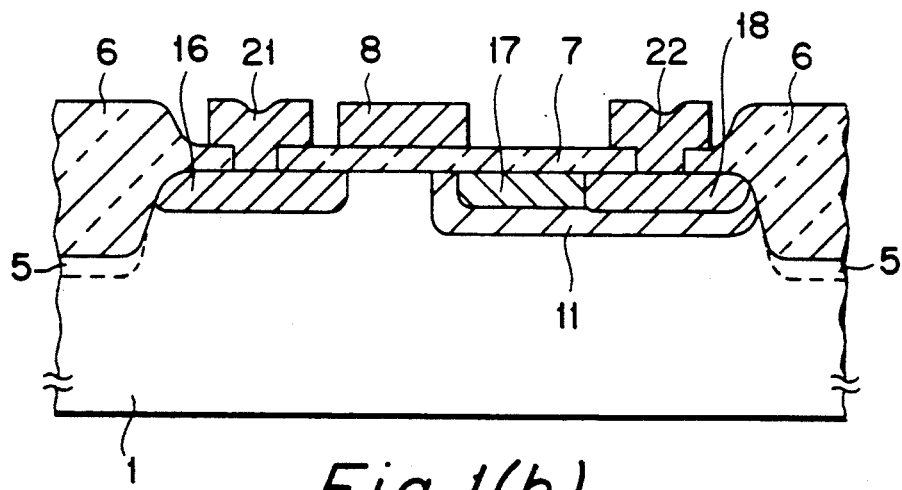

As shown in FIG. 1(a), the N+ type source region 16 and the N+ type drain region 18 are respectively connected to a source electrode 21 and a drain electrode 22, made of aluminum or the like, via contact opening 20. The gate electrode 8, source electrode 21, and drain electrode 22 are electrically connected to other semiconductor elements provided within the same substrate to form an electric circuit by means of an upper layer wiring formed via an interlayer insulating film on these electrodes.

Figure 2A:
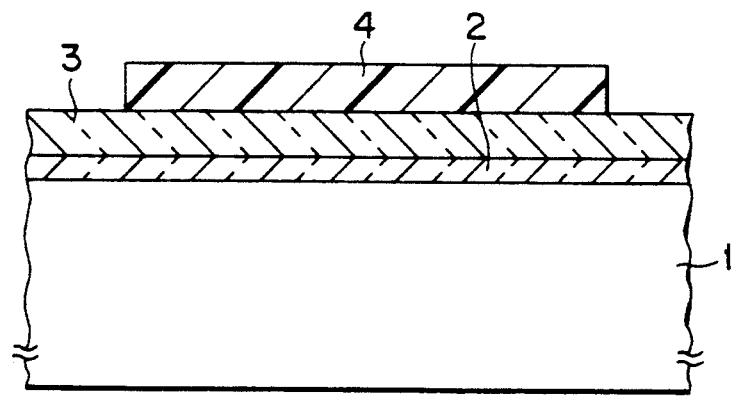
FIGS. 2(a) to 2(c) show sectional views illustrating the characteristic fabrication processes for the first embodiment of the invention.
Figure 2B:
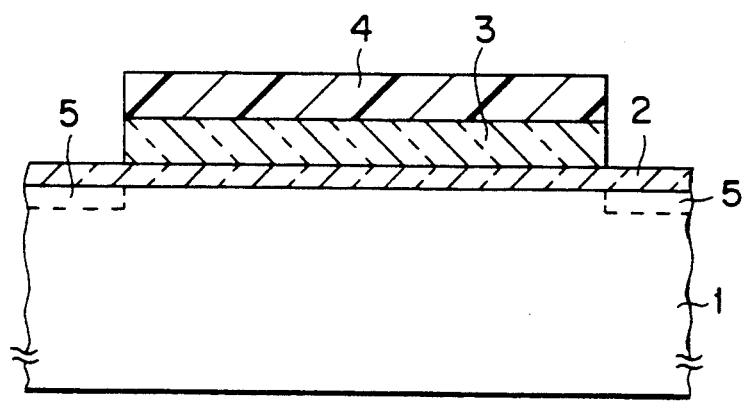
Figure 2C:
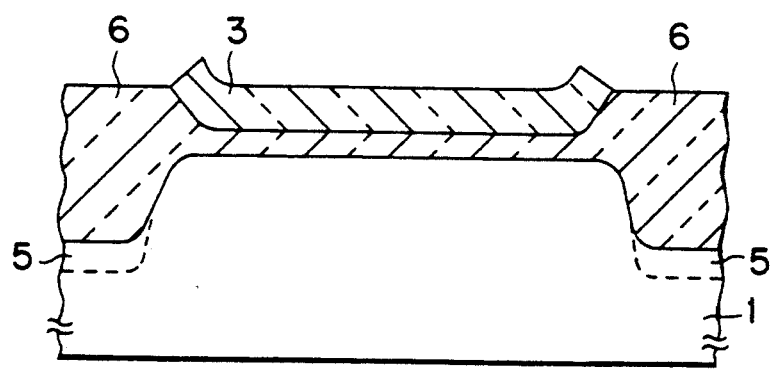
Figure 3A:
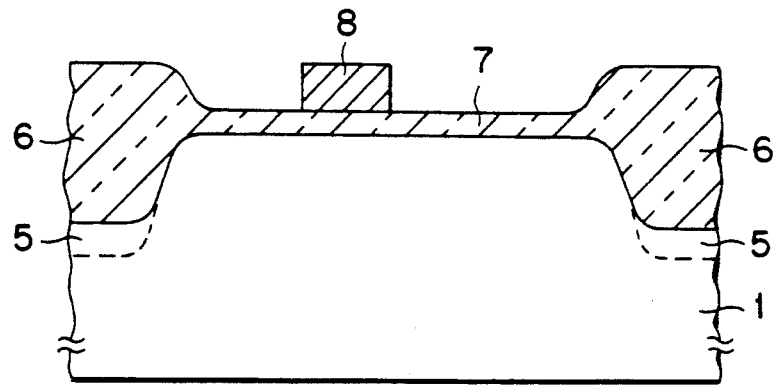
FIGS. 3(a) to 3(c) show sectional views illustrating the characteristic fabrication processes for the first embodiment of the invention.
Figure 3B:
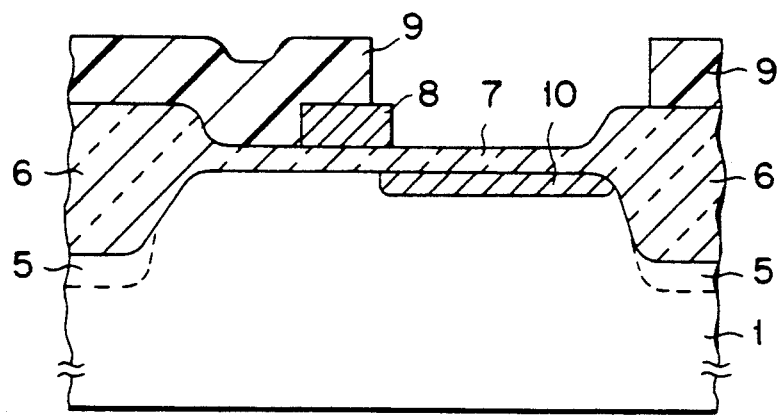
Figure 3C:
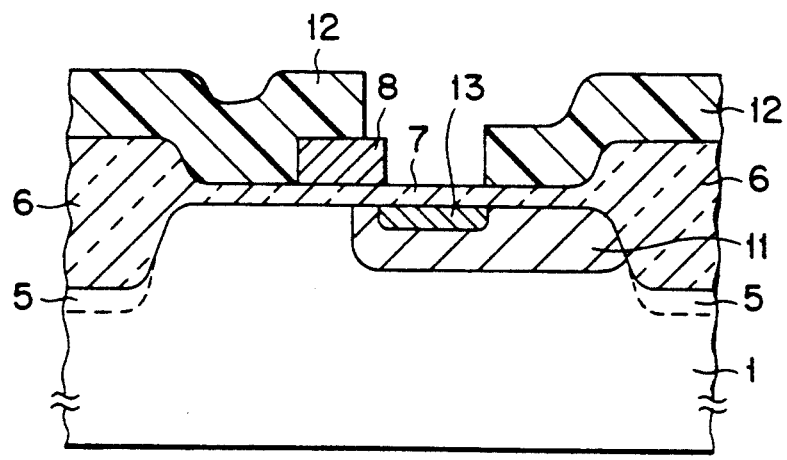

Next, the fabrication method of the first embodiment of the invention will be described. As shown in FIG. 2(a), a 500 Å thick silicon oxide film 2 is formed on one of the principal surfaces of the P type substrate 1, and a silicon nitride film with thickness of 1500 Å, for example, is formed on top of it by a CVD method. Further, a mask 4 is formed on an element formation region 30 (see FIG. 1(a)). Next, as shown in FIG. 2(b), the silicon nitride film 3 formed in the outside of the element formation region 30 is removed by an etching method. Further, a P+ type impurity region 5 is formed by implanting boron ions into the surface of the substrate 1 at an implantation energy of 100 keV and a dose of $10^{13}$ atoms/cm$^2$, by using the mask 4 and the silicon nitride film 3 as the mask. Next, as shown in FIG. 2(c), after removal of the mask 4, a 6000 Å thick field oxide film 6 is formed by a selective oxidation method in the ambient atmosphere of hydrogen-oxygen at 1000° C. Next, the silicon oxide film 2 formed on the surface of the substrate 1 is removed by a total etching method. At this point, a silicon oxide film is formed again on the surface of the substrate 1 by a thermal oxidation method, and removes once again this silicon oxide film by the total etching method. With such a procedure, substances that are harmful to the operation of the semiconductor elements, such as heavy metal elements, existed in the surface portion of the device formation region 30 can be removed, and it becomes possible to prevent both deterioration of a breakdown voltage of gate oxide film and that of long-term reliability of the film. Further, as shown in FIG. 3(a), a 500 Å thick gate oxide film 7 is formed by thermal oxidation method in a hydrogen-oxygen ambient atmosphere at 950° C. Then, a polycrystalline silicon layer is formed on top of it by a CVD method that uses the reducing action of SiH$_4$ at 600° C. Further, a gate electrode 8 with 5 μm gate length is formed by etching the polycrystalline silicon layer at an output power of 300 W and a pressure of 300 m Torr using a mixed gas of HBr and He. Next, a mask 9 is formed so as to cover at least the region reserved for the formation of the source region 16 as shown in FIG. 3(b), and an N type ion implanted region 10 is formed by implanting phosphorus ions at an implantation energy of 150 keV and a dose of $1 \times 10^{13}$ atoms/cm$^2$. This N type ion implanted region 10 is formed aligned with the gate electrode 8 and the field oxide film 6 in the part that is not covered by the mask 9. Next, by giving an annealing for 1 hour at 1000° C., the crystallinity of the damaged region in the substrate caused by the ion implantation is recovered, and at the same time an N− type offset region 11 is formed by the diffusion of phosphorus ions. Further, as shown in FIG. 3(c), a mask 12 is formed, and a P type ion implanted region 13 is formed by implanting boron ions at an implantation every of 50 keV and a dose of $5 \times 10^{15}$ atoms/cm$^2$. This P type ion implanted region 13 is formed aligned with the mask 12 and the portion of the gate electrode 8 that is not covered with the mask 12.

Figure 4A:
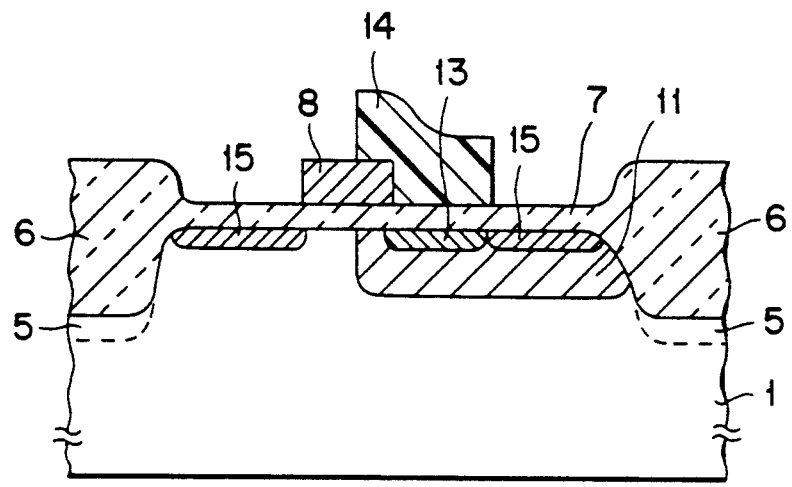
FIGS. 4(a) and FIG. 4(b) show sectional views illustrating the characteristic fabrication processes for the first embodiment of the invention.

Next, as shown in FIG. 4(a), a mask 14 is formed, then an N type ion implanted region 15 is formed by implanting arsenic ions at an implantation energy of 70 keV and a dose of $1 \times 10^{15}$ atoms/cm$^2$. It is desirable to form the mask 14 so as to have an N+ type drain region 18 to be formed in the following annealing process adjacent to a P type impurity region 17. The N type ion implanted region 15 is formed aligned with the field oxide film 6, the gate electrode 8, and the mask 14.

Figure 4B:
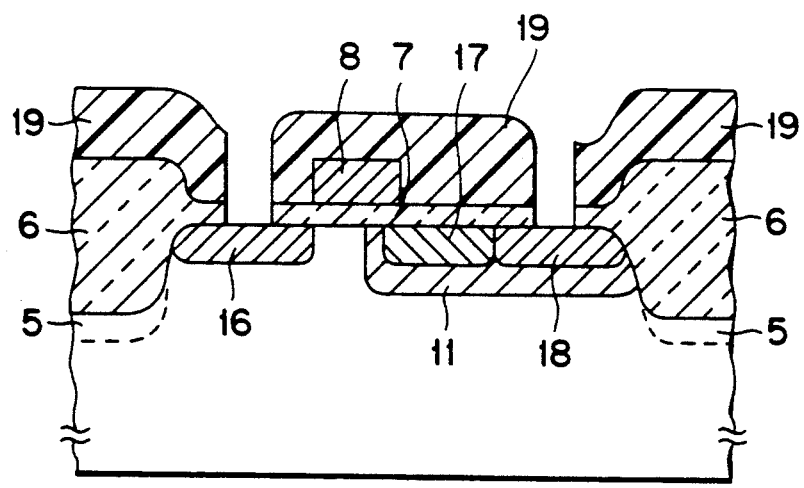

Next, by subjecting the sample to an annealing at 900° C. for 20 min, the crystallinity in the region of the substrate damaged by the ion implantation is recovered, and at the same time, and an N+ type source region 16 and an N+ type drain region 18 are formed by diffusing arsenic ions and a P type impurity region 17 is formed by diffusing boron ions, as shown in FIG. 4(b). Further, a mask 19 is formed, and contact openings 20 are provided in the oxide film 7 on the source region 16 and the drain region 18 by the etching method.

Next, after removal of the mask 19, aluminum-made source electrode 21 and drain electrode 22 are formed so as to fill in the contact openings 20. In this way the semiconductor device as shown in FIGS. 1(a) and 1(b) is completed.

Figure 5:
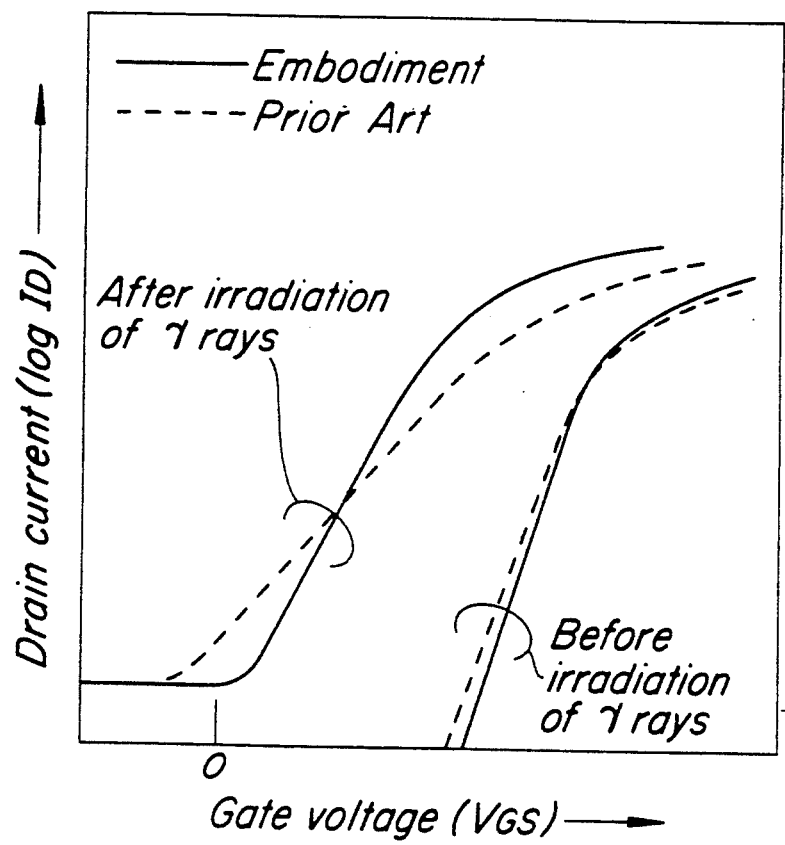
FIG. 5 is a graph describing the effect of the first embodiment of the invention.
Figure 10:
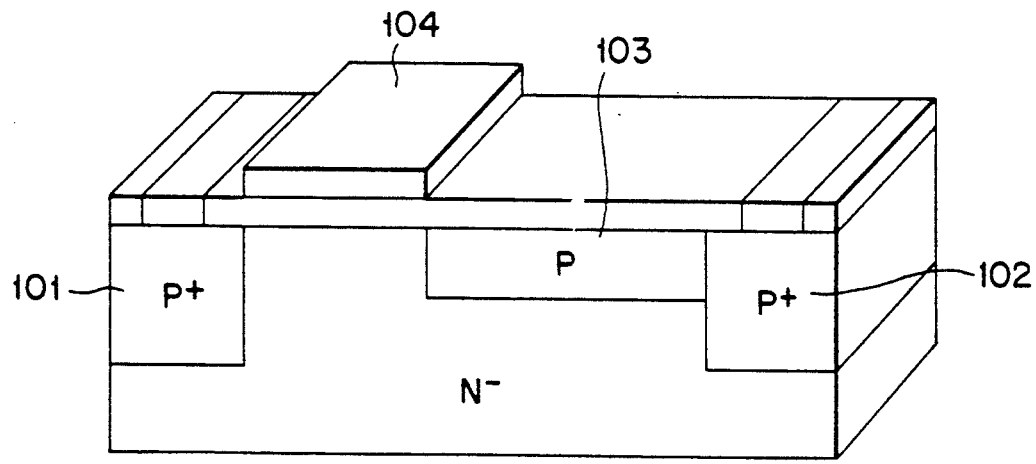
FIG. 10 is a perspective sectional view of a prior art.

FIG. 5 is a graph showing the curves for the gate voltage-drain current characteristic, in particular the subthreshold characteristic of the semiconductor device before and after exposure to radiations for describing the effect of this invention. The abscissa shows the gate voltage $V_{GS}$ and the ordinate shows the drain current $I_D$ in terms of the logarithmic scale log $I_D$. The characteristic for the MOSFET of this invention is shown in the solid line while the characteristic for the conventional device shown in FIG. 10 is shown in the broken line. Using gamma rays as the radiations, the energy by radiation dose of 1 Mrad was caused to be absorbed by the MOSFET in the state where the source, drain, and substrate were grounded and a voltage of 5 V was applied to the gate. The reason for the shift toward the negative voltage side of the voltage-current characteristic curve for both cases as a result of irradiation with gamma rays, is that the holes that are generated in the gate oxide film due to the incidence of the radiations are captured by the traps in the film to become immobilized positive charges. The decrease in the slope of the characteristic curve in the subthreshold region after the irradiation with gamma rays is caused by the generation of energy levels at the oxide film/silicon interface, but it should be noted that the change in the slope for the transistor of this invention is smaller than that for the prior art transistor. As in the above, it can be seen that the variation in the characteristic due to exposure to radiations is small for the transistor of this embodiment of the invention, and the resistance to radiations of the transistor is markedly improved.

Figure 6:
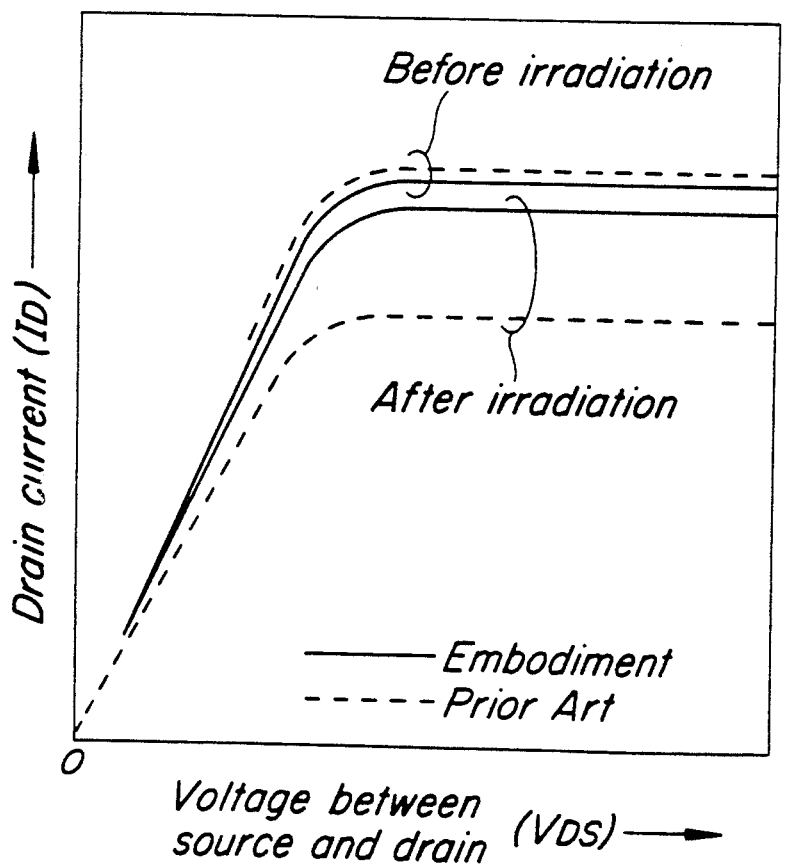
FIG. 6 is another graph describing the effect of the first embodiment of the invention.

FIG. 6 is a graph showing the dependence of the drain current $I_D$ on the voltage $V_{DS}$ between the drain and the source before and after exposure to radiations, for describing the effect of the embodiment. The characteristic curves for this embodiment and the conventional transistor shown in FIG. 10 are shown in the solid and the broken lines, respectively. Measurements were taken by using gamma rays as the radiations and under the same irradiation conditions of gamma rays as in the case of the graph in FIG. 5. Although the drain current $I_D$ was decreased as a result of irradiation with gamma rays, the amount of reduction in the drain current $I_D$ for the transistor of this embodiment is smaller compared with the reduction for the conventional device. In other words, it can be seen that the resistance to radiations of the MOSFET according to this embodiment is superior to that of the conventional transistor.

As described in the above, the MOSFET according to this embodiment is given a structure in which the $N^+$ type drain region 18 is provided within the $N^-$ type offset region 11 and the P type impurity region 17 is provided within the offset region between the drain region 18 and the gate electrode 8. Therefore, the carriers of the MOSFET reaches the drain region 18 by going through the offset region 11 without passing along the surface of the substrate 1 in the vicinity of the gate oxide film 7, so that even if there are generated energy levels at the interface of the substrate 1 and the gate oxide film 7 due to incidence of radiations, the carriers are less affected by the scattering due to the level with less reduction of the carrier mobility, making at possible to reduce the decrease in the drain current. In other words, according to the embodiment it is possible to reduce the characteristic change due to incidence of the radiations.

Figure 7:
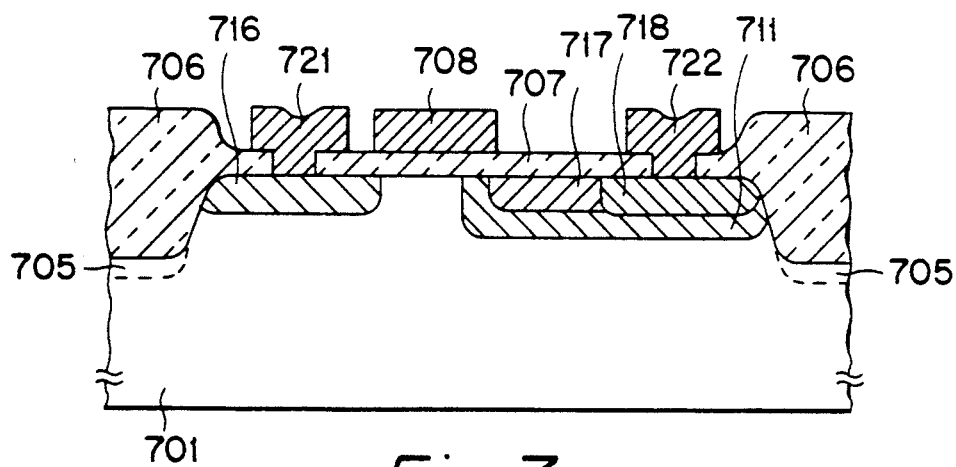
FIG. 7 is a sectional view showing a second embodiment of the invention.

Next, referring to FIG. 7, the second embodiment of the invention will be described. A field oxide film 706 for device isolation is formed on the surface of an N type substrate 701, and an $N^+$ type impurity region 705 for preventing the parasitic MOS effect is formed beneath the oxide film 706. On the surface of an device formation region that is surrounded by the field oxide film 706 there is formed a gate oxide film 707, and a polycrystalline silicon gate electrode 708 is formed on the gate oxide film 707. A $P^+$ type source region 716 having impurity density of $10^{21}$ atom/cm$^3$ and a $P^-$ type offset region 711 are formed on the surface part of substrate 1 matching with the gate electrode. A $P^+$ type drain region 718 having impurity density of $10^{21}$ atom/cm$^3$ is provided within the offset region 711, and an N type impurity region 717 is provided within the offset region between the drain region 718 and the gate electrode 708. The source region 716 and the drain region 718 are connected via the contact openings to aluminum-made source electrode 721 and drain electrode 722, respectively.

Next, referring to FIG. 8(c), the third embodiment of the invention will be described.

In the MOSFET of this embodiment, a field oxide film 802 for device isolation is formed on a P type silicon substrate 801.

A gate electrode 804 consisting of polycrystalline silicon doped with an N type impurity such as phosphorus or of a refractory metal such as tungsten is formed on the surface of a channel region via a gate oxide film 803. The high concentration N type layer 805 having impurity density of $10^{20}$ atom/cm$^3$ which becomes the source and the high concentration N type layer 806 having impurity density of $10^{20}$ atom/cm$^3$ which becomes the drain are formed. The low concentration N type layer 807 is formed in the offset region between the gate electrode 804 and the high concentration N type layer 806 which becomes the drain. Further, a low concentration P type layer 808 is formed in the surface layer of the offset region isolated from the channel region. Aluminum electrodes 809 which become the source and the drain electrodes are formed in the high concentration N type layers 805 and 806.

Next, referring to FIGS. 8(a) to 8(c), the fabrication method for the MOSFET of the third embodiment of this invention will be described.

Figure 8A:
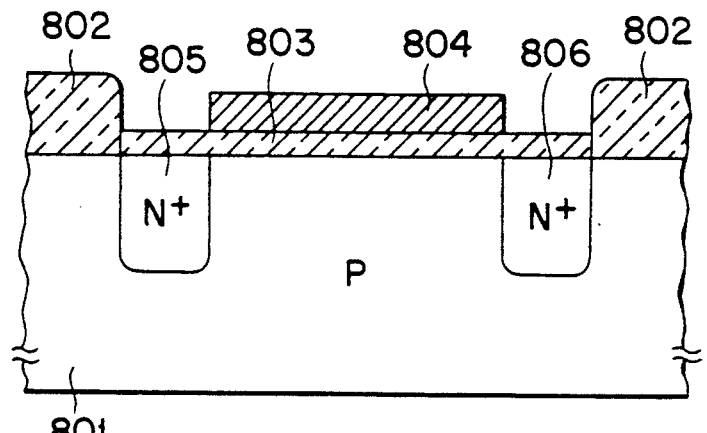
FIGS. 8(a) to 8(c) show sectional views arranged in the order of fabrication processes of a third embodiment of the invention.

First, as shown in FIG. 8(a), after forming the field oxide film 802 on the P type silicon substrate 801, and the gate oxide film 803 is formed on the surface of the device formation region, the gate electrode 804 consisting of polycrystalline silicon doped with an N type impurity such as phosphorus is formed on the channel region and the offset region. Next, high concentration N type layers 805 and 806 that are to become the source and the drain are formed by implanting high concentration arsenic or phosphorus ions in self-aligned manner using the gate electrode 804 as the mask.

Figure 8B:
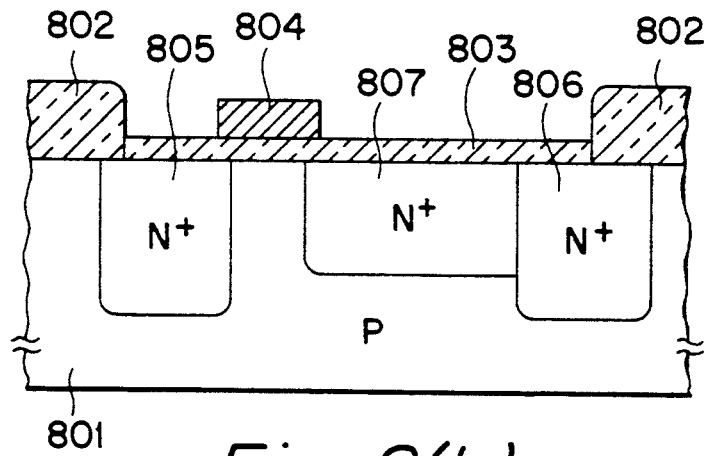

Next, as shown in FIG. 8(b), after obtaining the gate electrode 804 with desired shape by removing a part of the gate electrode 804 on the offset region, ion implantation of low concentration arsenic or phosphorus is carried out in self-aligned manner using the gate electrode 804 as the mask. Next, high concentration N type layers 805 and 806 that become the source and the drain and the implanted ions in the low concentration N type layer 807 that becomes the offset region are activated by heating the sample in a high temperature nitrogen ambient atmosphere.

Figure 8C:
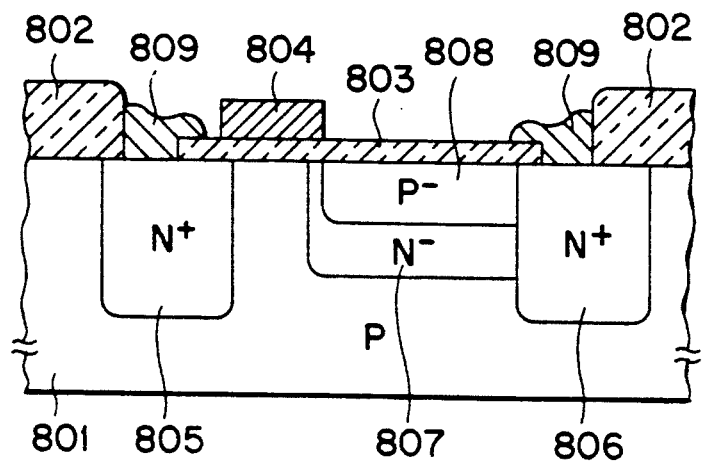

Next, as shown in FIG. 8(c), after implanting boron ions with the gate electrode 804 used as the mask, the low concentration P type layer 808 is formed by activating the implanted ions by heating the sample a nitrogen ambient atmosphere at high temperature. Finally, aluminum electrodes 809 that are brought into contact with the high concentration N type layers 805 and 806 are formed, completing the element part.

By providing the low concentration P type layer 808 with the opposite conductivity type to that of the offset region in the surface layer of the low concentration N type layer 807 which is the offset region, as in this embodiment, the drain current that flows in the offset region 807 passes through the interior of the substrate without going through the oxide film/silicon interface of the substrate surface. For this reason, even if the element is exposed to radiations forming energy levels in the oxide film/silicon interface, the drain current will be little affected by the charge scattering due to the levels that are generated. Therefore, it is possible reduce the effect of radiation damages such as the deterioration of the mobility or the accompanying decrease in the drain current.

In accordance with the fabrication method a shown in FIG. 8, it is possible to produce all of the high concentration N type layers 805 and 806, the low concentration N type layer 807, and the low concentration P type layer 808 in self-alignment with the gate electrode 804, so that the mask for producing the low concentration N type layer 807 and the low temperature P type layer 808 can be obviated.

Figure 9:
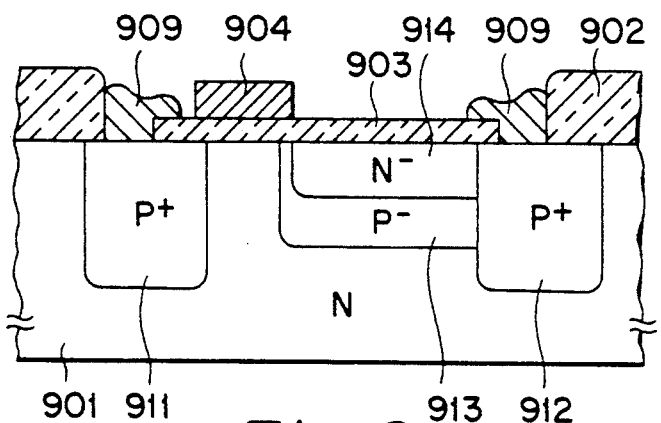
FIG. 9 is a sectional view of a fourth embodiment of the invention.

Next, referring to FIG. 9, the fourth embodiment of this invention will be described. This embodiment is the one in which the invention is applied to a high breakdown voltage MOSFET.

A field oxide film 902 for element isolation is formed on an N type silicon substrate 901. A gate electrode 904 is formed on the surface of the channel region via a gate oxide film 903. High concentration P type layers 911 and 912 having impurity density of $10^{20}$ atom/cm$^3$ that are to become the source and the drain are formed. A low concentration P type layer 913 is formed in an offset region between the gate electrode 904 and the high concentration P type layer 912 that is to become the drain. Further, a low concentration N type layer 914 is formed in the surface layer of the offset region isolated from the channel region.

Although the invention has been described with reference to specific embodiments, this description is not meant to be construed in a limiting sense. Various modifications of the disclosed embodiments as well as other embodiments of the invention, may be made without departing from the scope and spirit of the invention. It is therefore contemplated that the appended claims will cover any modifications or embodiments as fall within the true scope of the invention.

What is claimed is:

1. A semiconductor device comprising:
a semiconductor substrate of a first conductivity type;
source and drain regions of a second conductivity type formed in said semiconductor substrate, said first conductivity type being opposite to said second conductivity type, said drain region having a first portion facing said source region and a second portion located on an opposite side to said first portion;
an offset region of said second conductivity type having an impurity concentration lower than the drain region and formed in contact with said first portion of said drain region and extending toward said source region without being in contact with said source region, said second portion of said drain region being free from contact with said offset region;
an impurity region of said first conductivity type selectively formed in said offset region;
a gate insulating film covering a portion of said semiconductor substrate and a portion of said offset region between said source region and said impurity region; and
a gate electrode formed on said gate insulating film.

2. The semiconductor device as claimed in claim 1, wherein said gate insulating film is elongated over said impurity region and having a substantially uniform thickness.

3. A semiconductor device comprising:
a semiconductor substrate of a first conductivity type;
a field insulating film having a portion embedded in said semiconductor substrate;
a drain region of a second conductivity type formed in said semiconductor substrate in contact with said portion of said field insulating film;
a source region of said second conductivity type formed in said semiconductor substrate;
an offset region of said second conductivity type selectively formed in a portion of said semiconductor substrate between said drain and source regions in contact with said drain region;
an impurity region of said first conductivity type selectively formed in said offset region in contact with said drain region; and
a gate insulating film covering a part of said semiconductor substrate and a part of said offset region between said impurity region and said source region.

4. The semiconductor device as claimed in claim 3, wherein said gate insulating film is elongated over said impurity region and having a substantially uniform thickness.

5. A semiconductor device comprising:
a semiconductor substrate of a first conductivity type;
a field insulating film having a portion embedded in said semiconductor substrate;
an offset region of a second conductivity type formed in said semiconductor substrate in contact with said portion of said field insulating film;
a drain region of said second conductivity type selectively formed in said offset region with a depth shallower than a depth of said offset region and in contact with said portion of said field insulating film;
an impurity region of said first conductivity type selectively formed in said offset region in contact with said drain region;
a source region of said second conductivity type formed in said semiconductor substrate;
a gate insulating film covering a portion of said semiconductor substrate between said source region and said offset region; and
a gate electrode formed on said gate insulating film, said gate insulating film being elongated over said impurity region and having a substantially uniform thickness.

6. The semiconductor device as claimed in claim 5, wherein said gate insulating film is further elongated over said source and drain regions while having said substantially uniform thickness to provide an elongate insulating film over said source and drain regions, said semiconductor device further comprising first and second contact holes provided in said elongated insulating film to respectively expose parts of said source and drain regions and source and drain electrodes formed in contact respectively with said parts of said source and drain regions through said first and second contact holes.

* * * * *